US011774527B2

(12) United States Patent
Iwasawa et al.

(10) Patent No.: US 11,774,527 B2
(45) Date of Patent: Oct. 3, 2023

(54) RECEIVING COIL DEVICE AND MAGNETIC RESONANCE IMAGING APPARATUS INCLUDING THE SAME

(71) Applicant: FUJIFILM Healthcare Corporation, Kashiwa (JP)

(72) Inventors: Kohjiro Iwasawa, Chiba (JP); Yosuke Otake, Chiba (JP); Hideta Habara, Chiba (JP); Kazuyuki Kato, Chiba (JP); Toru Shirai, Chiba (JP); Yukio Kaneko, Chiba (JP); Hikaru Hanada, Chiba (JP)

(73) Assignee: FUJIFILM Healthcare Corporation, Chiba (JP)

( * ) Notice: Subject to any disclaimer, the term of this patent is extended or adjusted under 35 U.S.C. 154(b) by 0 days.

(21) Appl. No.: 17/584,501

(22) Filed: Jan. 26, 2022

(65) Prior Publication Data

US 2022/0268864 A1 Aug. 25, 2022

(30) Foreign Application Priority Data

Feb. 19, 2021 (JP) .................................. 2021-025629

(51) Int. Cl.
*G01R 33/34* (2006.01)
*G01R 33/54* (2006.01)

(52) U.S. Cl.
CPC ..... *G01R 33/34084* (2013.01); *G01R 33/543* (2013.01)

(58) Field of Classification Search
CPC ............ G01R 33/34084; G01R 33/543; G01R 33/34007; G01R 33/3415; G01R 33/56509; A61B 5/004; A61B 5/055
See application file for complete search history.

(56) References Cited

U.S. PATENT DOCUMENTS

| 10,509,085 | B2 * | 12/2019 | Leussler | G01R 33/283 |
| 10,827,948 | B1 * | 11/2020 | Tramm | A61B 5/7405 |
| 2013/0131498 | A1 * | 5/2013 | Taracila | G01R 33/34084 324/322 |
| 2021/0278489 | A1 * | 9/2021 | Iwasawa | G01R 33/34046 |
| 2022/0113362 | A1 * | 4/2022 | Qin | H01F 27/06 |

FOREIGN PATENT DOCUMENTS

| CN | 113495239 A | * 10/2021 | |
| EP | 3779493 A1 | * 2/2021 | ........... A61B 5/0036 |
| JP | 2018-27152 A | 2/2018 | |

OTHER PUBLICATIONS

English translation of CN113495239A provided by Espacenet. Translation acquired on Oct. 21, 2022. (Year: 2022).*

* cited by examiner

*Primary Examiner* — Rishi R Patel
(74) *Attorney, Agent, or Firm* — Paul Teng

(57) ABSTRACT

The receiving coil device includes one or a plurality of receiving coils configured to cover a head of a subject, a base portion on which the head of the subject is to be placed, a holder portion supported by the base portion, one of the receiving coils being fixed to the holder portion, a mechanism portion configured to bring the receiving coil fixed to the holder portion into close contact with a part of the head, and further, a detection unit configured to detect a physical quantity related to a displacement of the holder portion on the holder portion or the base portion. The physical quantity detected by the detection unit is sent to an MRI apparatus including the receiving coil device.

12 Claims, 11 Drawing Sheets

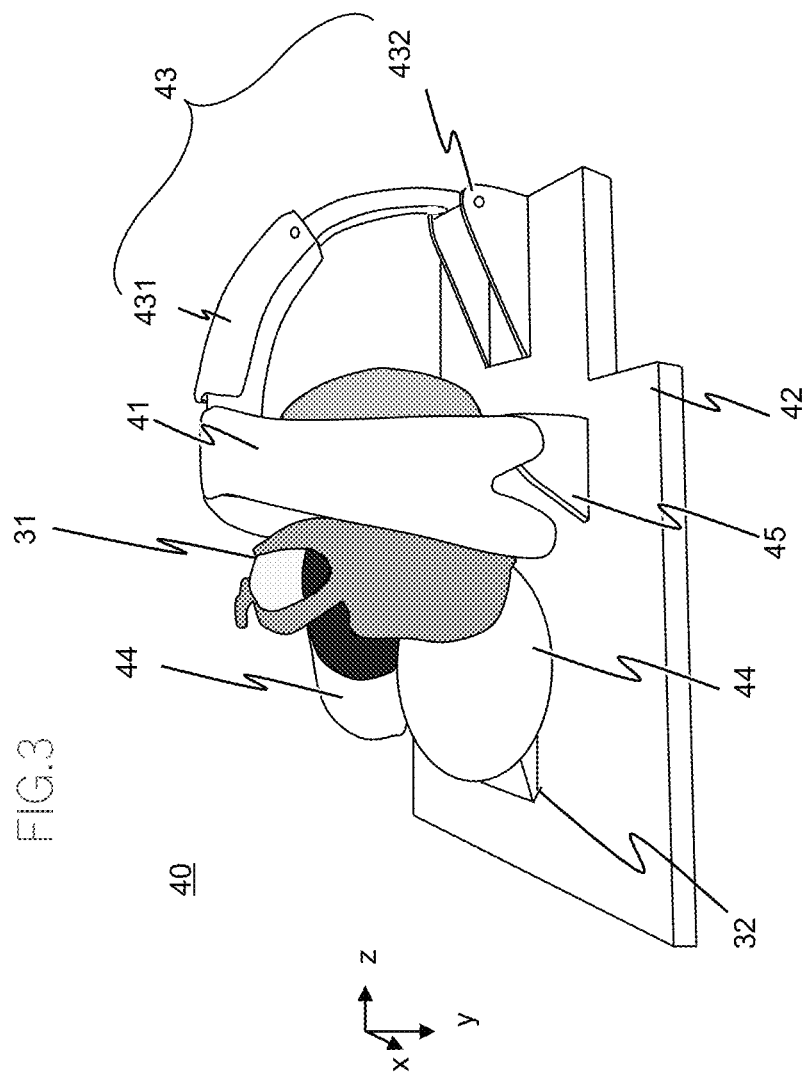

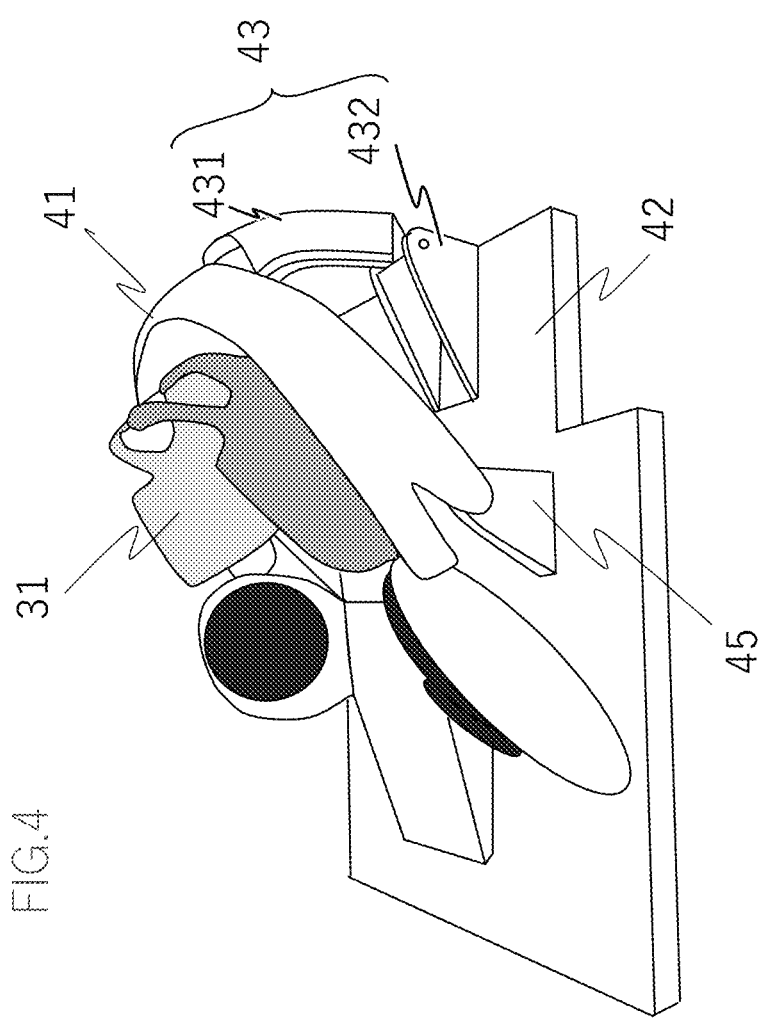

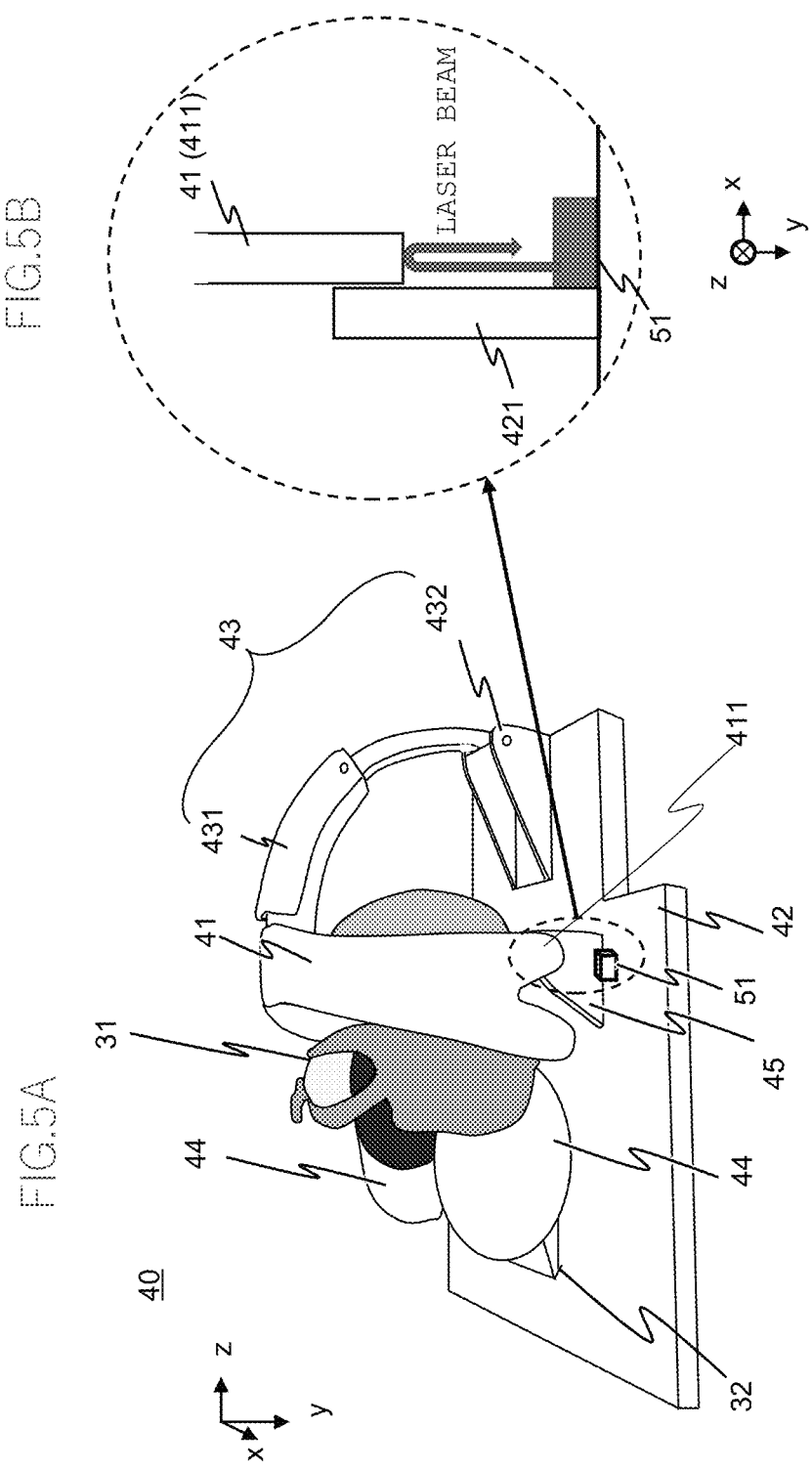

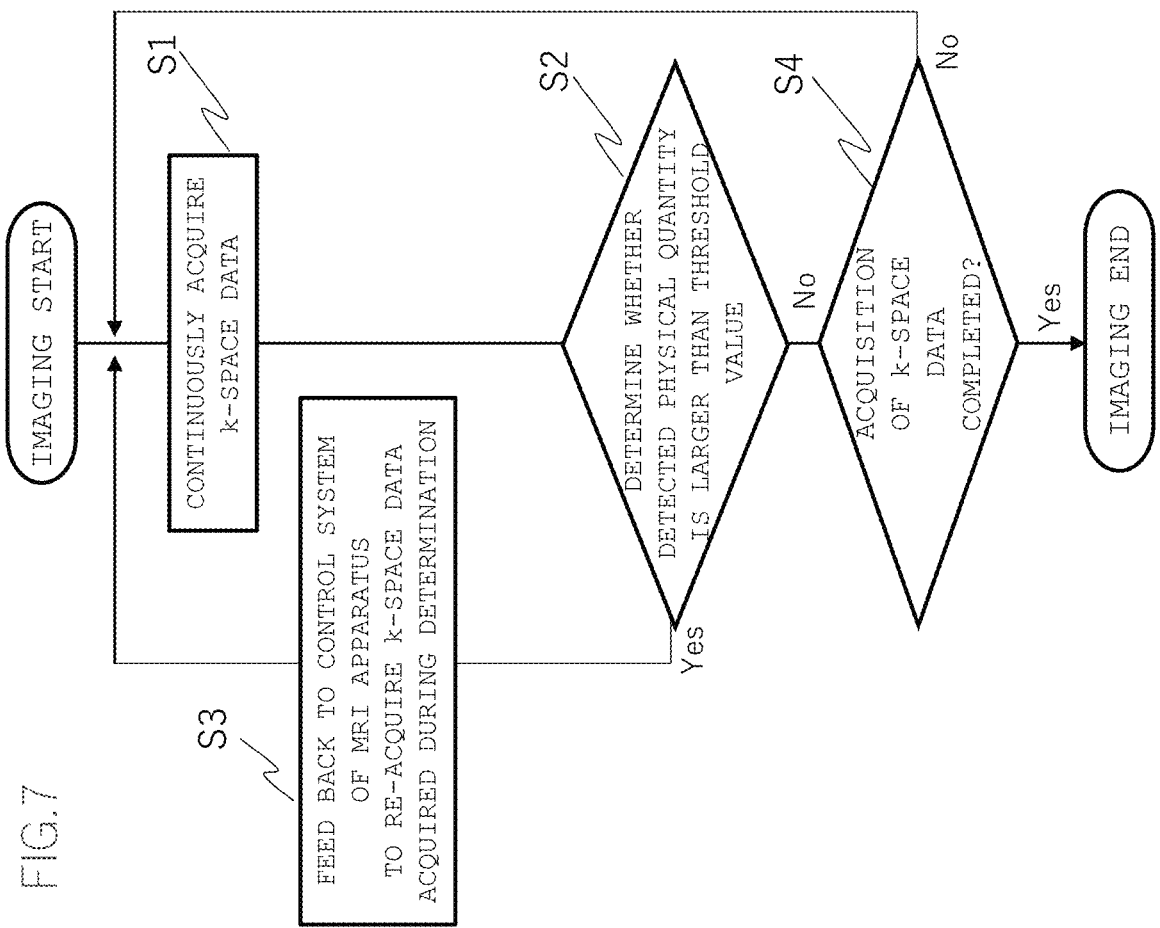

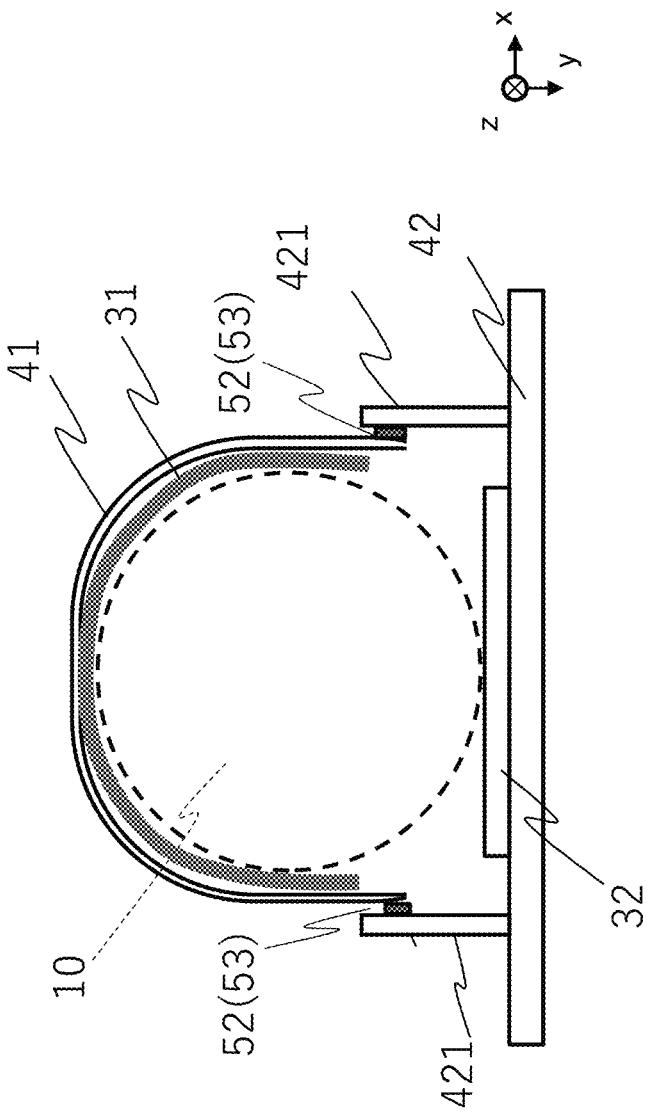

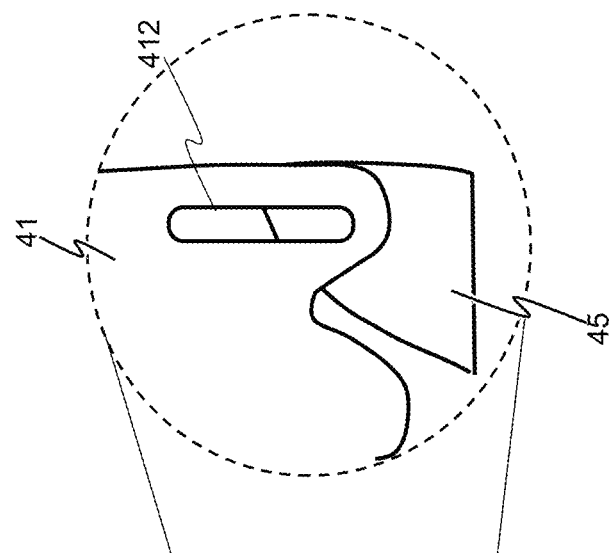
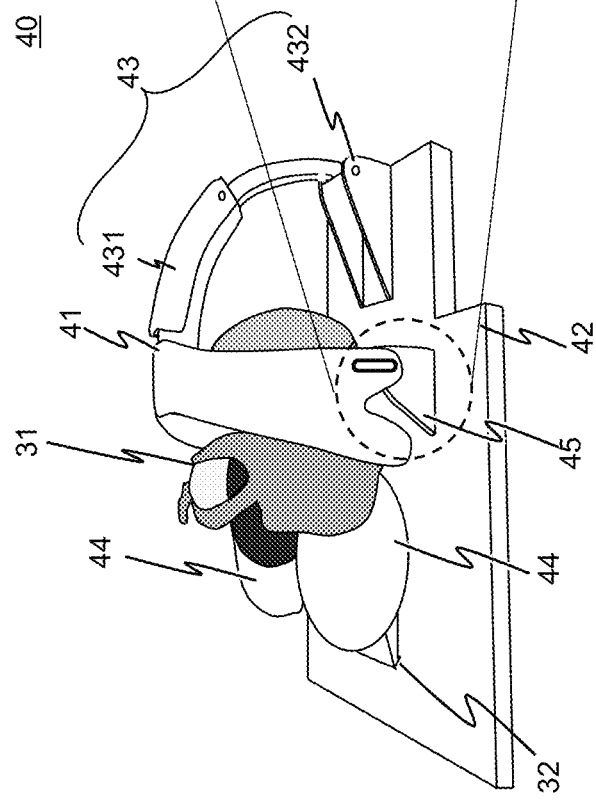

RECEIVING COIL DEVICE AND MAGNETIC RESONANCE IMAGING APPARATUS INCLUDING THE SAME

BACKGROUND OF THE INVENTION

1. Field of the Invention

The present invention relates to a coil device for transmitting and receiving a nuclear magnetic resonance signal used in a magnetic resonance imaging apparatus (hereinafter referred to as an MRI apparatus), in particular, to a receiving coil device for head imaging.

2. Description of the Related Art

An MRI apparatus applies a high-frequency magnetic field to a subject placed in a static magnetic field, receives a nuclear magnetic resonance (NMR) signal induced thereby, and processes the NMR signal to generate an image of the subject. A dedicated RF coil is used to apply the high-frequency magnetic field and receive the NMR signal. A coil of the MRI apparatus includes various coil devices having different forms depending on transmission or reception, a direction of the static magnetic field, a size of a covering region, a shape of an imaging target portion, and the like. Since a receiving coil has high sensitivity by being disposed in close contact with the subject, the receiving coil is often worn on the imaging target portion of the subject during imaging. It is an important problem to reduce effort and time during wearing and to bring the subject into a wearing state in which the subject is kept in close contact with the coil without discomfort (wearing performance).

When there is a body movement of the subject during MRI imaging, the image deteriorates, and therefore it is necessary to detect the body movement during imaging and remove an influence of the body movement. Especially, when imaging a brain or the like and there is a head movement of a degree that is equal to or slightly larger than a resolution of the image, the movement also has a large influence on the image. Therefore, a technique has been developed in which a body movement of a head during head imaging is detected from a receiving coil or a marker worn on the head of a subject. For example, JP-A-2018-27152 discloses a technique in which a receiving coil is divided into two parts including a back-head side and a face side, an air bag is disposed at a lower portion on a side on which a back-head is placed, and a movement of the head is detected by detecting a change in an air pressure of the air bag. There is also a method in which a marker is attached to a nose of a subject and is imaged by a camera, and a movement of the marker, that is, a movement of a head of the subject is detected from an image imaged by the camera.

When imaging a head, the imaging is often performed with a back-head down and a face up, and the back-head placed on a coil or a support thereof has little movement. Therefore, the method disclosed in JP-A-2018-27152 cannot detect the movement of the head with high sensitivity. It is also conceivable to dispose an air bag between a coil disposed on a face side and a front-head of the subject as disclosed in JP-A-2018-27152. However, in this case, in addition to work for wearing the coil, there is onerous work for disposing the air bag at an appropriate position between the coil and the subject, and a workflow for wearing deteriorates.

The method for attaching the marker to the subject has a problem that additional work is required and a workflow deteriorates. The method further has problems that comfort of the subject deteriorates such as itching of the nose, and a movement of the nose alone may be erroneously detected as a body movement even though the head does not move.

SUMMARY OF THE INVENTION

An object of the invention is to provide a technique of detecting a movement of a front-head with high sensitivity without deteriorating a workflow including wearing a receiving coil on a subject in setting before imaging.

The invention solves the above problem by detecting a movement of a member (holder portion) that fixes a coil covering a front surface side of a head. The movement is detected as a physical quantity by a detection unit that is fixed to a base portion that supports a holder or fixed between the base portion and the holder portion.

That is, a receiving coil device of the invention includes one or a plurality of receiving coils configured to cover a head of a subject, a base portion on which the head of the subject is to be placed, a holder portion supported by the base portion, one of the receiving coils being fixed to the holder portion, a mechanism portion configured to bring the receiving coil fixed to the holder portion into close contact with a part of the head, and a detection unit configured to detect a physical quantity related to a displacement of the holder portion.

In the invention, the detection unit may be a combination of a marker and a camera that images the marker. In this case, the receiving coil device may include any one in the combination (for example, the marker).

An MRI apparatus of the invention includes the above-mentioned receiving coil device as a receiving coil. When the detection unit of the receiving coil device is the combination of the marker and the camera that images the marker, the camera may be connected to the MRI apparatus.

According to the invention, since the detection unit is fixed to a member that supports a coil of the receiving coil device, the detection unit can be attached to the subject only by attaching the receiving coil device to the subject, and a workflow when wearing the coil can be greatly improved. In addition, according to the invention, since a movement of an opposite side (for example, the front surface side) is detected instead of a part of the subject (for example, the back-head) placed on the coil device, detection sensitivity of the physical quantity is improved. Further, it is possible to eliminate discomfort or a physical disorder feeling of the subject when the marker is attached to the subject.

BRIEF DESCRIPTION OF THE DRAWINGS

FIG. 3 is a diagram showing a configuration example of a receiving coil device before a detection unit is attached;

FIG. 4 is a diagram showing a wearing state and a retreated state of the receiving coil device shown in FIG. 3;

FIGS. 5A AND 5B are diagrams showing a receiving coil device according to a first embodiment;

FIG. 7 is a diagram showing an operation of an MRI apparatus including the receiving coil device according to the first embodiment;

FIG. 8 is a diagram showing an arrangement of a receiving coil according to a modification of the first embodiment;

FIGS. 11A and 11B are diagrams showing a modification of the third embodiment.

DESCRIPTION OF THE PREFERRED EMBODIMENTS

Hereinafter, embodiments of a receiving coil device and an MRI apparatus of the invention will be described with reference to the drawings.

Figure 1:
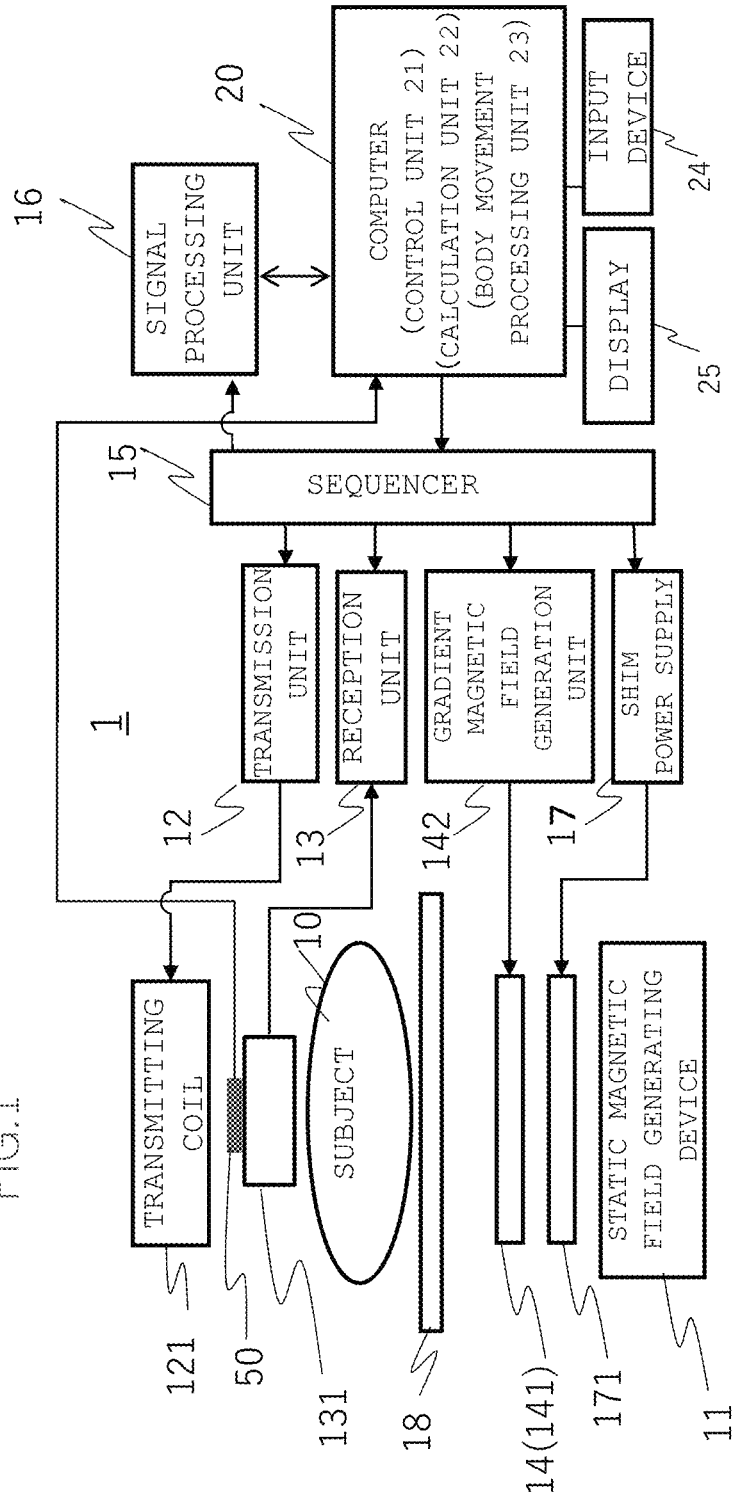
FIG. 1 is an overall configuration diagram showing one embodiment of an MRI apparatus applied to the invention.

First, one embodiment of an MRI apparatus applied to the invention will be described. As shown in FIG. 1, an MRI apparatus 1 includes a static magnetic field generating device 11 that generates a static magnetic field in a space in which a subject 10 is to be placed, a transmission unit 12 that applies a high-frequency magnetic field pulse to the subject placed in the static magnetic field space, a reception unit 13 that receives a nuclear magnetic resonance signal generated from the subject which is irradiated with the high-frequency magnetic field pulse, a gradient magnetic field generation unit 14 that generates a gradient magnetic field that gives position information to the nuclear magnetic resonance signal, a sequencer 15 that operates the transmission unit 12, the reception unit 13, and the gradient magnetic field generation unit 14 based on a predetermined pulse sequence, a signal processing unit 16, and a computer 20 that controls the entire apparatus and performs calculations such as correction and image reconstruction on the nuclear magnetic resonance signal. A part or all of functions of the signal processing unit 16 may also be executed by the computer 20.

The static magnetic field generating device 11 includes an electromagnet such as a permanent magnet, a normal conducting magnet, or a superconducting magnet, and a driving unit therefor. The static magnetic field generating device 11 generates a uniform static magnetic field in an imaging space in which the subject is to be placed. A static magnetic field magnet includes a vertical magnetic field, a horizontal magnetic field, and the like depending on a direction of the generated static magnetic field, and either of the vertical magnetic field or the horizontal magnetic field can be adopted in the invention. A shim coil 171 and a shim power supply 172 for maintaining uniformity of the static magnetic field may also be disposed. The subject 10 is usually placed in the imaging space in a state of being placed on a bed 18 such that an imaging portion substantially coincides with a center of the static magnetic field.

The transmission unit 12 includes a high-frequency transmitter and a high-frequency amplifier (neither is shown) and an RF coil 121 (simply a transmitting coil) for transmission. The transmitting coil 121 is disposed in the imaging space and applies a high-frequency magnetic field pulse that causes nuclear magnetic resonance to atomic nuclei of a tissue constituting the subject. Although not limited, in general, atomic nuclei to be subjected to the MRI apparatus are protons, and the transmitting coil is adjusted to generate a high-frequency magnetic field of a resonance frequency.

The reception unit 13 includes a receiving RF coil 131 (simply referred to as a receiving coil) that receives the nuclear magnetic resonance signal generated from the subject, an amplifier, a quadrature detector, an A/D converter, and the like (none is shown). The reception unit 13 amplifies the nuclear magnetic resonance signal received by the receiving coil 131, converts the amplified nuclear magnetic resonance signal into digital signals of two systems, and sends the digital signals to the signal processing unit 16. FIG. 1 shows a case where the transmitting coil 121 and the receiving coil 131 are respectively made of separate coils. Alternatively, the receiving coil may also serve as the transmitting coil 121, and in this case, a switch for switching between transmission and reception is inserted.

Figure 2:
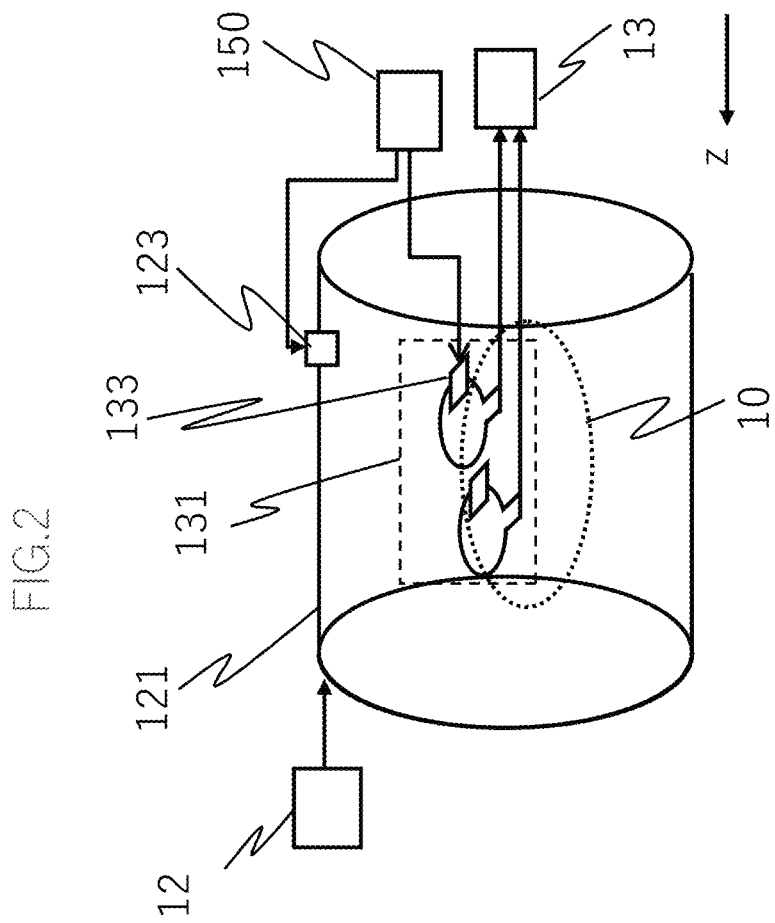
FIG. 2 is a diagram showing a relation between an RF transmitting coil and an RF receiving coil.

FIG. 2 shows an example of an arrangement of the transmitting coil 121 and the receiving coil 131 in an MRI apparatus having a horizontal magnetic field. In the example shown in FIG. 2, the transmitting coil 121 is a birdcage RF coil having a size for covering the entire subject placed in the static magnetic field space, and is connected to the transmission unit 12. The receiving coil 131 includes an array coil disposed in close contact with an examination portion (here, a head) of the subject. The array coil is a coil in which a plurality of surface coils each having a loop shape are arranged, and each of the surface coils is connected to the reception unit 13. Although FIG. 2 shows only two surface coils, the number and arrangements of the surface coils may have various configurations. As a circuit configuration of a birdcage coil and a multiple array coil, a known configuration can be adopted. Although a detailed description thereof is omitted in the present description, the birdcage coil and the multiple array coil include a coil conductor and a circuit element that adjusts a resonance frequency. Magnetic connection prevention circuits 123 and 133 are respectively inserted into the transmitting coil 121 and the receiving coil 131. The magnetic connection preventing circuit 123 deactivates the transmitting coil 121 when the receiving coil 131 is activated, and the magnetic connection preventing circuit 133 deactivates the receiving coil 131 when the transmitting coil 121 is activated. The magnetic connection preventing circuit 123 and 133 are connected to a magnetic connection preventing circuit driving device 150.

The receiving coil 131 includes a support structure for supporting the receiving coil 131 to be worn on the subject, and a mechanism for bringing the receiving coil 131 into close contact with the subject. The receiving coil 131 including the structure and the mechanism is referred to as the receiving coil device. In the MRI apparatus according to the present embodiment, the receiving coil device includes a detection unit 50 that detects a body movement of the subject. The receiving coil device including the detection unit 50 will be described in detail later.

The gradient magnetic field generation unit 14 includes three sets of gradient magnetic field coils 141 that generate gradient magnetic fields in three axial directions including x, y, and z axes orthogonal to one another, and a gradient magnetic field power supply 142 that drives the gradient magnetic field coils 141.

The sequencer 15 sends commands to the transmission unit 12, the gradient magnetic field power supply 142, and the reception unit 13 under the control of the computer 20 (control unit). Thus, based on a pulse sequence set in the sequencer 15, the high-frequency magnetic field pulse is generated, a gradient magnetic field pulses are generated from the gradient magnetic field coils 141, the nuclear magnetic resonance signal is received, and a number of nuclear magnetic resonance signals necessary for the image reconstruction is acquired. The acquired nuclear magnetic resonance signal is passed to the computer 20 as k-space data.

The computer 20 is a general-purpose computer or workstation that includes a CPU or a GPU, a memory, a control unit 21 that controls the entire apparatus including the sequencer 15, and a calculation unit 22 that performs calculation such as the image reconstruction in which the k-space data is used. Functions of the control unit 21 and the calculation unit 22 are executed by a CPU (GPU) reading program stored in advance in a recording device or the like. The pulse sequence is one of such a program, and there are various pulse sequences which defer depending on imaging methods. The pulse sequence to be executed is determined based on a pulse sequence selected by a user according to an imaging purpose and a portion, and imaging parameters set by the user.

The functions of the control unit 21 and the calculation unit 22 are the same as functions of a control unit and a calculation unit provided in a known MRI apparatus. Further, the computer 20 according to the present embodiment inputs a body movement detection signal from the detection unit 50 attached to the receiving coil device, performs control such as interruption and resumption of imaging and NMR signal re-measurement based on the body movement detection signal, and performs correction of eliminating an influence of the body movement on a reconstructed image based on the body movement detection signal. Necessary functions of the computer 20 are shown as a body movement processing unit 23 in FIG. 1.

The computer 20 is connected with an input device 24 for the user to input imaging conditions, commands that are necessary for imaging, a display 25 that displays data being processed by the computer 20, an image that is a processing result, and the like, and a storage unit such as an external storage device. The connection includes wired, wireless and networked connections. The computer 20 includes an input port for inputting a signal from an external measuring machine, and receives the body movement detection signal from the detection unit 50 via the input port.

Next, an embodiment of the receiving coil device will be described. As described above, the receiving coil device includes the detection unit 50 that detects the body movement of the subject. An attachment position of the detection unit 50 differs depending on a mode of the detection unit 50, and thus a structure of the receiving coil device in a state in which the detection unit 50 is not attached will be described first. FIG. 3 shows an example of a receiving coil device 40 for a head. In the following description, a left-right direction of the subject (an x direction in the drawing) when the receiving coil device is worn on the subject is referred to as a left-right direction of the receiving coil device, and a direction orthogonal to the left-right direction and a body axis direction of the subject (a front-back direction of the head: a y direction in the drawing) is referred to as an up-down direction.

The receiving coil device 40 mainly includes a coil body (the receiving coil 131) and a mechanism that supports the coil body. In the example shown in FIG. 3, the receiving coil device 40 includes, as the coil body, a front coil 31 (referred to as an A-side coil) to be worn from a top-head side of the subject to a front-head, and a rear coil 32 (referred to as a P-side coil) to be worn on a back-head. Each of these coils is connected to the reception unit 13 of the MRI apparatus 1. The mechanism that supports the coil body includes a holder portion 41 to which the A-side coil 31 is fixed, a base portion 42 on which the P-side coil 32 is disposed, and a holder support portion 43 that supports the holder portion 41 with respect to the base portion 42. In the embodiment shown in FIG. 3, side panels 44 are provided to bring the P-side coil into close contact with the subject from left and right side surfaces of the subject.

The A-side coil 31 and the P-side coil 32 can be each formed of a multi-array coil in which a plurality of surface coils are arranged as shown in FIG. 2. A circuit element such as a capacitor or an inductor that adjusts reception frequencies of the coils is inserted into each conductor loop constituting the surface coils as necessary, and the nuclear magnetic resonance signal can be received. In each of the A-side coil 31 and the P-side coil 32, sizes, the number, and arrangements of the surface coils, a position of a circuit device, and the like are designed according to a shape and a size of a portion to be applied. For example, in the A-side coil 31 that covers a front surface side of the subject, a region in which no conductor loop or circuit device is disposed is a portion corresponding to eyes of the subject, and the portion is opened or transparent.

FIG. 3 shows a case where two coils including the A-side coil 31 and the P-side coil 32 are provided as the coil body. Alternatively, a receiving coil device including third and fourth coils, such as a receiving coil for a neck (not shown), or a receiving coil device including only the A-side coil 31 to be fixed to the holder portion 41 is also applicable to the invention.

Next, a structure for supporting the coil body and a mechanism for bringing the coil body into close contact with the subject will be described.

The base portion 42 is a substantially plate-shaped member made of a non-magnetic material. The P-side coil 32 is disposed on an upper surface of the base portion, and the back portion of the head of the subject is placed on the P-side coil 32. In order to ensure the close contact between the P-side coil 32 and the subject, the base portion 42 may be formed with a concave portion that receives the back portion of the head on the upper surface, or a buffer material such as a sponge (not shown) may be disposed between the base portion 42 and the P-side coil 32.

The holder portion 41 is a thin plate-shaped member made of a non-magnetic material. The A-side coil 31 is fixed to the holder portion 41. Fixing of the coil is not particularly limited as long as the fixing is performed by a detachable fixing unit such as a screw or a snap, and the coil may be fixed at one place or a plurality of places. The holder portion 41 has an elongated shape curved from a central portion toward the base portion in the left-right direction. The central portion is fixed to the base portion 42 via the holder support portion 43. A length of the holder portion 41 in a longitudinal direction is a length in which left and right end portions of the curved holder portion are slightly separated from the base portion 42. The holder portion 41 does not interfere with the base portion 42 even when a position of the holder portion 41 is changed by an operation of the holder support portion 43 described later.

The holder support portion 43 is fixed to the base portion 42 to be located on a top-head side of the subject when the head of the subject is placed on the base portion 42. The holder support portion 43 includes a mechanism that moves the A-side coil 31 from a position (wearing position) where the A-side coil 31 is worn to cover the front-head of the subject to a position (retreat position) where the A-side coil 31 is retreated to the top-head side of the subject as shown in FIG. 4. In the embodiment, the mechanism includes a slide portion 431 (movable portion) whose one end is fixed to the holder portion 41, and a fixing portion 432 that connects the other end of the slide portion 431 and the base portion 42 in a stepped manner.

The slide portion 431 has a curved shape and includes an outer tube fixed to the holder portion 41 and an inner tube fixed to the fixing portion 432. By sliding the inner tube in the outer tube, the holder portion 41 fixed to a top end of the outer tube and the A-side coil 31 fixed to the holder portion 41 can be moved between the wearing position and the retreat position along the shape of the slide portion. Although not shown, the slide portion 431 includes a stopper that stops a movement of the outer tube at a desired position. As the stopper, a known configuration such as a push button and a hole that engages with the push button can be adopted. A movable range of the slide portion 431 is designed to correspond to different subject sizes, so that the holder portion 41 can be fixed to the position that is the wearing position by operating the stopper in a state in which the A-side coil 31 is brought into close contact with the subject utilizing a stepped force of the fixing portion 432 regardless of whether the subject has a large head size or a small head size. However, as a configuration in which the A-side coil 31 is worn in a close contact state, the stopper is not essential. For example, it is also possible to use another method such as making a frictional force between the outer tube and the inner tube larger than the stepped force of the fixing portion 432.

Further, in the embodiment of FIG. 3, guide portions that guide a movement of the holder portion 41 are provided on the base portion 42. The guide portions 45 are a pair of left and right plate-shaped members corresponding to a left end side and a right end side of the holder portion 41 having a curved shape. Each of the guide portions 45 is substantially perpendicular to a principal plane direction of the base portion 42. The left and right guide portions 45 are in contact with left and right end portions of the holder portion 41. Thus, the holder portion 41 is supported by one point fixed to the holder support portion 43 and two contact points of the guide portions 45 on both sides, a stable structure is possible at each position of the holder portion 41, and a stable operation can be ensured when the holder portion 41 moves. The left and right two points (contact points) are not fixed to the base portion 42, and thus the movement of the holder portion 41 accompanying the body movement of the subject head can be regarded as a movement integral with the body movement, and the body movement can be accurately detected by a detection unit for body movement detection described later.

In the receiving coil device 40 configured as described above, in a state in which the head of the subject is placed on and brought into close contact with the P-side coil 32 on the base portion 42, the holder portion 41 to which the A-side coil 31 is fixed is moved from the retreat position to the wearing position to fix the A-side coil 31 to the fronthead of the subject. At this time, the receiving coil device 40 can be worn on the subject in a state in which the receiving coil device 40 is brought into close contact with the subject due to step performance of the fixing portion 432. Therefore, the movement of the head of the subject can be directly detected as the movement of the holder portion 41.

Based on the structure of the receiving coil device 40 described above, embodiments of a detection unit for body movement detection will be described below, and processing of an MRI apparatus including the receiving coil device 40 according to each embodiment will be described below.

First Embodiment

In a receiving coil device according to the present embodiment, a distance meter that detects a change in a distance between an end portion of a holder portion and a base portion is used as the detection unit 50 for body movement detection.

Hereinafter, an attachment position of the distance meter and physical quantities to be measured will be described with reference to the drawings. In the receiving coil device 40 according to the present embodiment, as shown in FIGS. 5A and 5B, a distance meter 51 is fixed in proximity to the guide portion 45 of the base portion 42. As the distance meter 51, a known distance meter such as an optical distance meter, an ultrasonic distance meter, or a laser distance meter can be used. The distance meter 51 is connected to the MRI apparatus via a cable that is not shown. The distance meter 51 is located at a position at which a position of an end portion 411 of the holder portion 41 that is in contact with the guide portion 45 can be detected. In the shown example, the distance meter 51 is fixed on the base portion 42 to be in contact with the guide portion 45. The distance meter 51 continuously measures the distance between the end portion 411 of the holder portion 41 and the base portion 42 (distance meter 51), generates an electrical signal corresponding to the distance or a change in the distance, and sends the electrical signal to the control unit 21 of the MRI apparatus. A sampling speed at which the MRI apparatus captures the body movement detection signal is not particularly limited. When there is a periodic body movement, the sampling speed is preferably a cycle sufficiently shorter than a cycle of the body movement, and is preferably several times or less than repetition time TR, although the sampling speed also depends on a pulse sequence.

The distance meter 51 may be attached to a vicinity of one of the guide portions 45 on left and right sides, or may be attached to both of the guide portions 45. When the distance meter 51 is attached to one of the guide portions 45, it is possible to mainly detect the body movement of the head of the subject in the up-down direction. When the distance meter 51 is attached to the guide portions 45 on the left and right sides, it is possible to detect not only the movement in the up-down direction but also the movement in the left-right direction based on an asymmetry of the movement in the left-right direction.

Figures 6A, 6B, 6C:
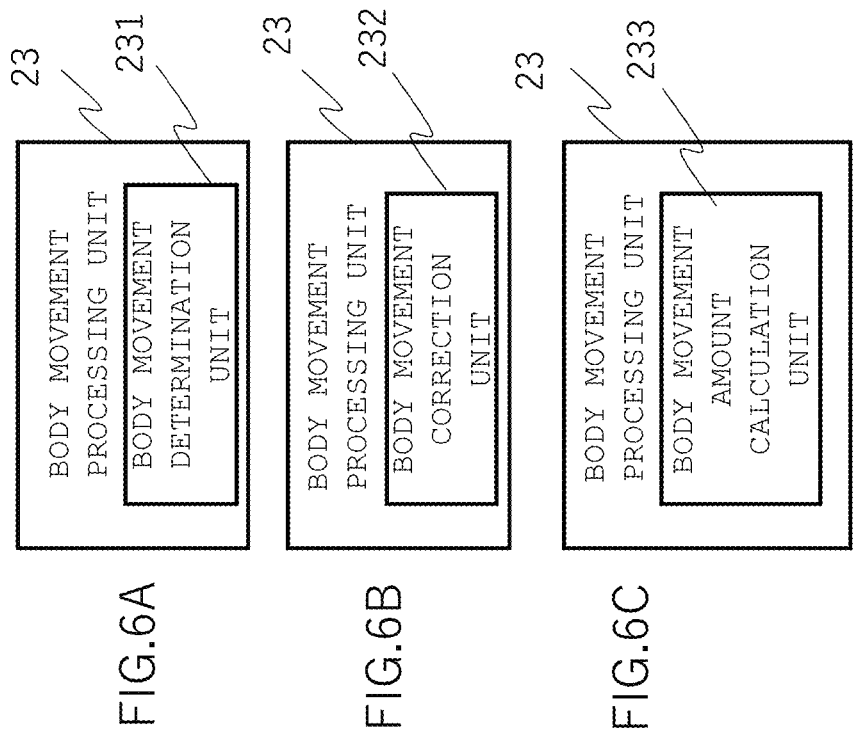
FIGS. 6A to 6C are diagrams showing configurations of a body movement processing unit according to the first embodiment to a third embodiment.

The MRI apparatus according to the present embodiment determines a necessity of re-measurement based on a body movement signal from the distance meter 51, and performs re-measurement according to a result of the determination. Therefore, as shown in FIG. 6A, the body movement processing unit 23 includes a body movement determination unit 231. A threshold value for determining a magnitude of the body movement is set in advance in the body movement determination unit 231. For example, the threshold value may be set by default, or the user may set an allowable value of the body movement based on a resolution or the like of an image with the input device 24 of the MRI apparatus 1.

Next, an operation of the MRI apparatus 1 to which the body movement signal is input from the distance meter 51 will be described with reference to FIG. 7. When imaging is started, the nuclear magnetic resonance signal is measured in accordance with the predetermined pulse sequence, and acquisition of the k-space data is started under control of the control unit 21 (S1).

When the imaging is started, the body movement processing unit 23 (body movement determination unit 21) receives the body movement signal from the distance meter 51, and compares a physical quantity measured by the distance meter 51, that is, a distance from the distance meter fixed to the base portion 42 to the end portion 411 of the holder portion 41 or a change value from an initial value with the threshold value set in advance (S2). For example, when the body movement determination unit 21 determines that the change value is larger than the threshold value, the body movement determination unit 21 sends an instruction to the control unit 21 to re-acquire the k-space data acquired when the body movement signal is acquired (S3).

The control unit 21 performs control to re-measure the k-space data when an unallowable body movement fluctuation occurs. In S2, when it is determined that the body movement signal is equal to or less than the threshold value, the acquisition of the k-space data is continued until all the target k-space data is acquired (S4), and the imaging is completed.

A flow in FIG. 7 is based on a premise that the body movement is temporary or periodic and that a position of the subject returns to an initial set position. However, in the determination step S2, when the body movement signal continuously exceeds the threshold value, it is expected that the position of the subject is deviated from the initial position, and therefore, the pulse sequence may be re-executed instead of re-acquiring a part of the k-space data.

According to the present embodiment, by attaching the distance meter 51 as the detection unit 50 to the base portion 42, it is possible to integrate work of attaching the coil to the subject and work of attaching the detection unit for body movement detection. Accordingly, it is not necessary to bring the detection unit into close contact with the subject or attach the detection unit to the subject, and workability can be greatly improved. Since a movement of the holder portion worn in close contact with the subject is detected, the movement of the subject can be substantially detected, and the body movement can be detected with high accuracy. Moreover, since a position of the detection unit 50 is apart from the subject, the body movement can be detected without affecting an MRI image.

Further, according to the present embodiment, by retaking only data acquired when there is a body movement, it is possible to obtain an image from which the influence of the body movement is eliminated without significantly extending imaging time.

Modifications of First Embodiment

In the first embodiment, the distance meter 51 is used as the detection unit 50 that detects the body movement, and the distance meter 51 is fixed to the base portion 42. Alternatively, an accelerometer 52 (first modification) or a pressure gauge 53 (second modification) can be used as the detection unit 50.

FIG. 8 shows a configuration example in which the accelerometer 52 or the pressure gauge 53 is used.

The accelerometer 52 is not limited, and a small acceleration sensor that utilizes a change in capacitance or a piezoelectric effect can be used. The accelerometer 52 is fixed to the holder portion 41 that moves integrally with the subject. Alternatively, as shown in FIG. 8, the accelerometer 52 is fixed between the holder portion 41 and the guide portion 45 in contact with the holder portion 41. In this case, the accelerometer 52 may be fixed to either a holder portion side or a guide portion side. Although FIG. 8 shows an example in which the accelerometer 52 or the pressure gauge 53 is disposed on both left and right sides, the accelerometer 52 or the pressure gauge 53 may be disposed on only one side. When the accelerometer 52 or the pressure gauge 53 is disposed on both sides, accuracy of detecting a body movement amount can be improved by adding outputs (absolute value of an amount of change) of both the detection units 50.

According to such an arrangement, the accelerometer 52 can mainly detect a movement of the holder portion 41 in the up-down direction. When the holder portion 41 moves integrally with the body movement of the subject, the movement is detected as a change in capacitance or a change in electrical resistance due to the piezoelectric effect in the accelerometer 52.

As the pressure gauge 53, a known small strain gauge such as a semiconductor strain gauge or an electrostatic capacitance strain gauge can be used. Similarly to the accelerometer 52, the pressure gauge 53 is fixed between the holder portion 41 and the guide portion 45 in contact with the holder portion 41, or may be fixed to either the holder portion 41 or the guide portion 45. The end portion of the holder portion 41 and the guide portion 45 are in contact with each other in a state in which a certain amount of pressure is applied in advance. Accordingly, when the holder portion 41 moves in the left-right direction along with the body movement of the subject, the pressure between the holder portion 41 and the guide portion 45 changes and is detected by the pressure gauge 53. Thus, the pressure gauge 53 can accurately detect the movement of the subject in the left-right direction.

The accelerometer 52 or the pressure gauge 53 is connected to the MRI apparatus 1 as in the case of the distance meter 51 according to the first embodiment, and the detected signal is processed by the body movement processing unit 23. Processing contents are the same as those according to the first embodiment, and thus a description thereof will be omitted.

Effects of the modifications are the same as those according to the first embodiment, and not only the movement in the up-down direction but also the movement in the left-right direction can be accurately detected. Therefore, the modifications can be suitably applied to imaging in which a high-precision image is required.

Second Embodiment

In the first embodiment, a case is described in which the body movement signal from the detection unit 50 is used to determine whether to re-acquire the k-space data. In the present embodiment, the calculation unit 22 of the MRI apparatus corrects an image during image reconstruction based on the body movement signal. Therefore, as shown in FIG. 6B, the body movement processing unit 23 includes a body movement correction unit 232. As a method for correcting a body movement in an image, various methods have been known conventionally and any of the methods can be adopted. Here, an example of correcting the body movement in a phase encoding direction will be described.

The phase encoding direction is determined by a pulse sequence used for imaging, and thus in the present embodiment, when the distance meter 51 is used as the detection unit 50, a pair of distance meters 51 may be preferably used on both left and right sides to accurately detect a body movement in multiple directions. Alternatively, the distance meter 51 or the accelerometer 52 that mainly detects the movement in the up-down direction and the pressure gauge 53 that mainly detects the movement in the left-right direction may be used in combination. For example, when the pressure gauge 53 is disposed as one detection unit 50 on both the left and right sides between the guide portion 45 and the holder portion 41, the direction of the body movement can also be detected since the direction in which the pressure changes is different when there is a body movement on the left side and the right side.

Figure 9:
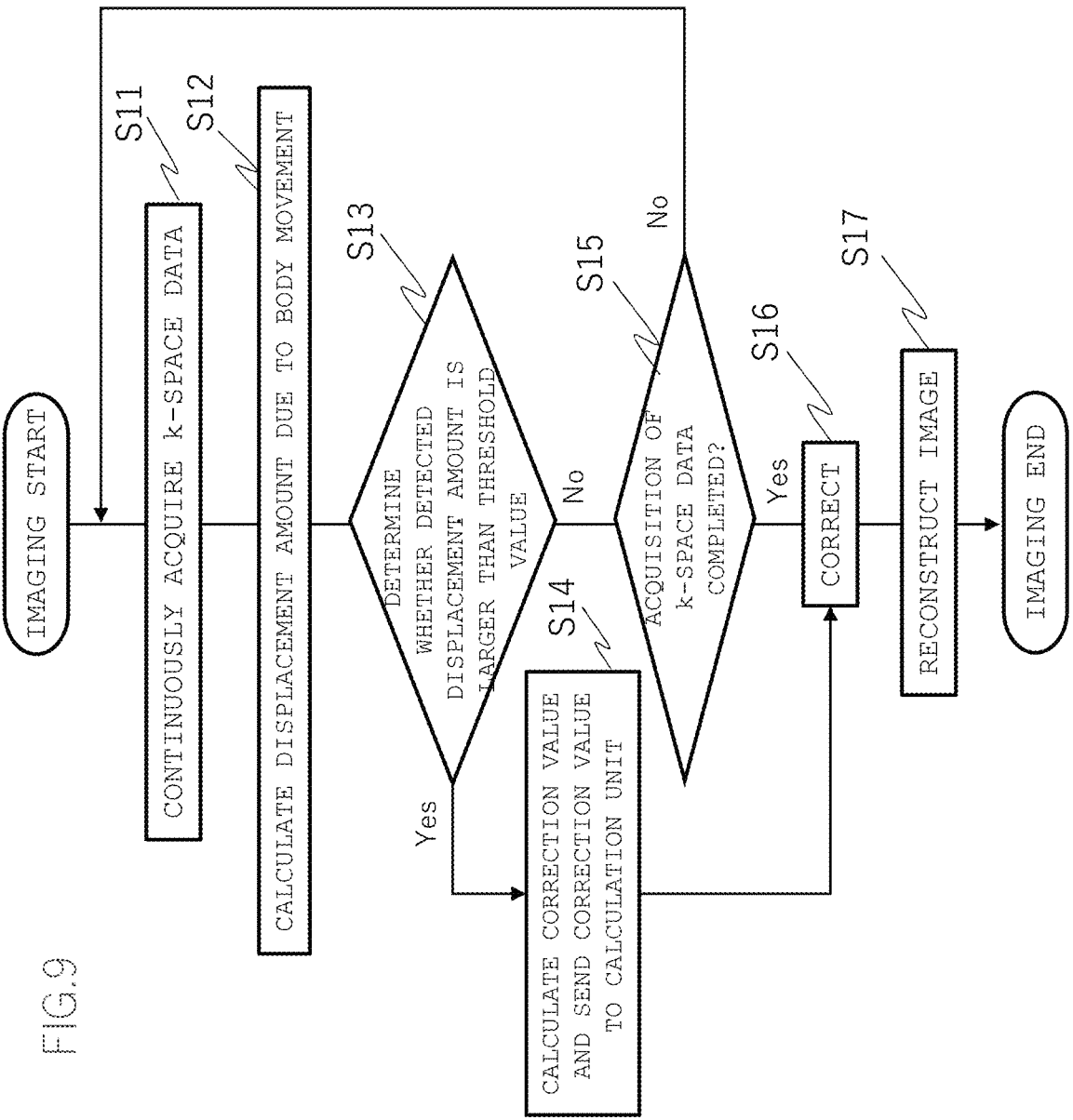
FIG. 9 is a diagram showing an operation of an MRI apparatus according to the second embodiment.

FIG. 9 shows a flow of processing of the MRI apparatus according to the present embodiment.

When the imaging is started, the nuclear magnetic resonance signal is measured in accordance with the predetermined pulse sequence, and acquisition of the k-space data is started under control of the control unit 21 (S11). When the imaging is started, the body movement processing unit 23 (body movement correction unit 232) receives the body movement signal from the detection unit 50, and calculates a displacement amount ΔY in the phase encoding direction with physical quantities measured by the detection unit 50, that is, an up-down displacement amount and a left-right displacement amount of the end portion 411 of the holder portion 41 (S12).

Next, it is determined whether the displacement amount ΔY is larger than a predetermined threshold value (S13). When the displacement amount ΔY is larger than the threshold value, a time point at which the body movement signal is acquired is stored in a storage unit (not shown), and a phase correction value is calculated (S14). A position change amount in a real space (movement amount ΔY) is a phase change proportional to time (Δθ=γGyΔyt: γ is a magnetic rotation ratio, Gy is a phase encoding gradient magnetic field) in a measurement space. The body movement correction unit 232 calculates a phase change Δθ in a k-space as a correction value with the displacement amount ΔY.

After the acquisition of the k-space data is completed (S16), the body movement correction unit 232 corrects the k-space data when the body movement change is detected with the calculated correction value (S16). Then, the calculation unit 22 reconstructs the image with the corrected k-space data (S17), which is the same as that of a normal MRI apparatus.

According to the present embodiment, by disposing the detection unit 50 at a plurality of positions or disposing two or more types of detection units, it is possible to improve accuracy of body movement information that can be detected. Accordingly, it is possible to correct the image by using the body movement information afterward, and it is possible to obtain an image from which the influence of the body movement is eliminated without extending imaging time.

Third Embodiment

In the first embodiment, an example is described in which the detection unit 50 is attached to the support structure of the receiving coil device. In the present embodiment, a marker that can be detected by a camera is attached to the support structure of the receiving coil device, and the body movement is detected from an image of the camera in which the marker is projected. That is, in the present embodiment, the detection unit 50 includes a marker attached to the support structure and a camera that images the marker. The MRI apparatus acquires an imaging signal from the camera via an input port, and calculates the body movement (movement amount) in the body movement processing unit 23.

Figure 10:
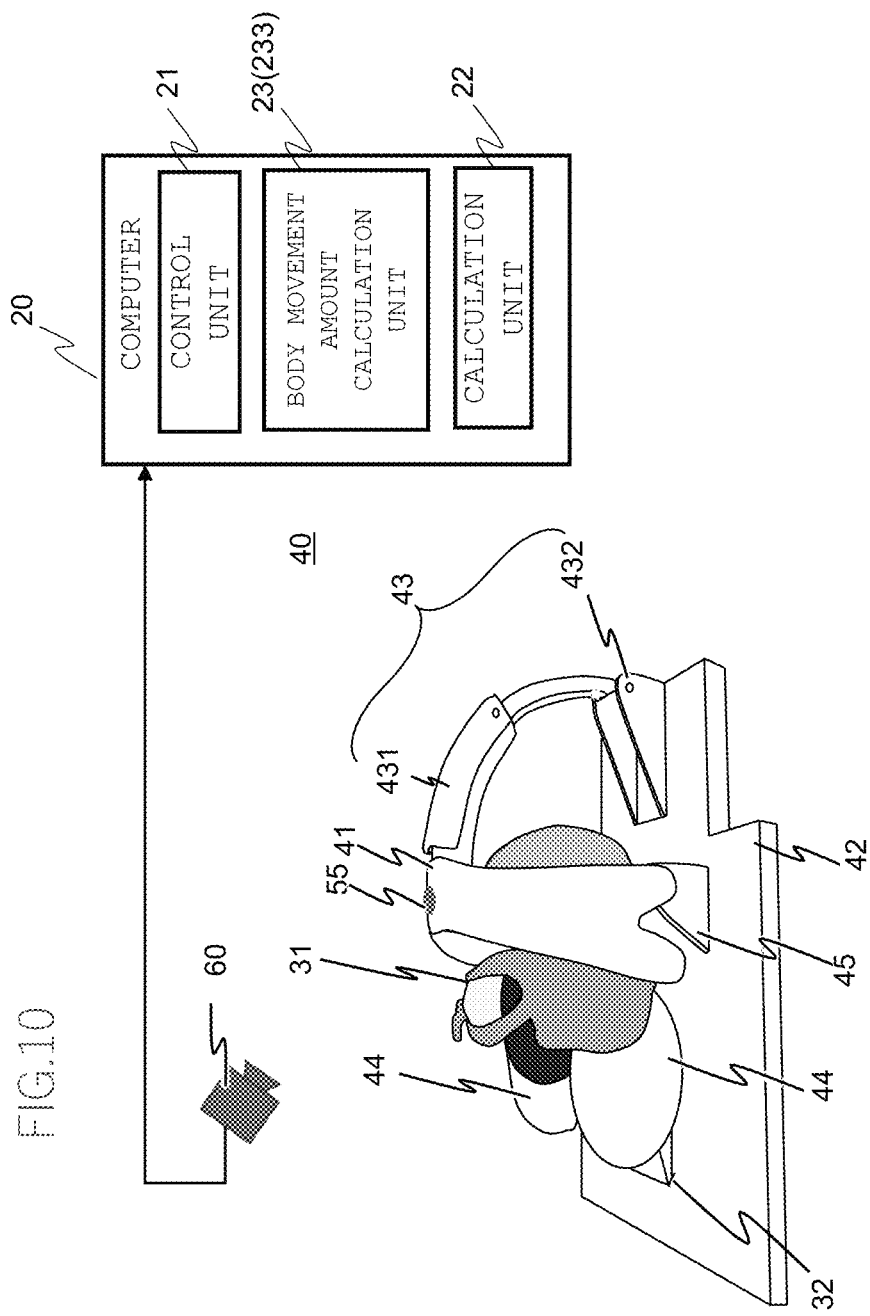
FIG. 10 is a diagram showing a configuration of a detection unit according to the third embodiment.

FIG. 10 shows an arrangement example of the marker 55 and the camera 60 in the present embodiment. Also in FIG. 10, the receiving coil device 40 includes the holder portion 41 to which the receiving coil 31 (A-side coil) is fixed, and the base portion 42 that supports the holder portion 41. The marker 55 is attached to substantially a central portion of the holder portion 41. However, a position of the marker 55 is not limited to the central portion as long as the marker 55 can be imaged by the camera 60, and a plurality of markers 55 may be disposed instead of one marker 55. A material and a shape of the marker 55 are not particularly limited as long as the marker 55 can be identified by the image of the camera 60. The marker 55 may be a part of the holder portion 41 or may be fixed to the holder portion 41 by a fixing unit such as a screw or an adhesive.

The camera 60 is fixed inside a gantry that provides an examination space in which the subject is to be placed or is fixed outside the gantry at a position where the inside can be imaged. FIG. 10 shows one camera 60, and a plurality of cameras may be provided.

As shown in FIG. 6C, the body movement processing unit 23 of the MRI apparatus according to the present embodiment includes a body movement amount calculation unit 233 instead of the body movement determination unit 231. The body movement amount calculation unit 233 receives the image from the camera 60, and calculates the body movement amount from a change in the marker 55. The body movement amount is calculated, for example, by extracting the marker from each image frame and calculating a change amount in a marker position in the image.

A flow of the processing of the MRI apparatus according to the present embodiment is the same as the flow shown in FIG. 7 except that the above-mentioned body movement amount calculation step is added, and the body movement amount is calculated by the body movement amount calculation unit 233 before the determination step S2 in FIG. 7. Thereafter, re-acquiring a part of the k-space data in accordance with the magnitude of the body movement amount is the same as that according to the first embodiment.

According to the present embodiment, the same effects as those according to the first embodiment can be attained, and since no device or the like directly connected to the MRI apparatus is fixed to a receiving coil device side, the influence on the image obtained by the MRI apparatus can be completely eliminated by the device.

Modification

The third embodiment is an example in which the marker 55 fixed to the holder portion 41 is imaged by the camera 60. Alternatively, as shown in FIGS. 11A and 11B, a long hole 412 may be formed in the up-down direction at an end portion of the holder portion 41 that is in contact with the guide portion 45, and the camera 60 may be disposed at a position where the end portion of the holder portion 41 can be imaged, so that an end portion of the guide portion 45 that can be seen through the hole 412 may be imaged by the camera 60. In this case, a marker that enhances identifiability may be disposed at the end portion of the guide portion 45, or lines Lmax and Lmin that indicate an allowable value of the body movement amount may be formed at both upper and lower positions along the hole 412. Accordingly, it is possible to determine whether the body movement amount exceeds the allowable value from the image of the camera without calculating the body movement amount, and it is possible to perform simpler control.

The embodiments of the receiving coil device and the MRI apparatus including the receiving coil device are described above, but the invention is not limited to the embodiments or the drawings used in the description of the embodiments, and various modifications and additions can be made. For example, in the embodiments, arrangements of the detection unit 50 are described with the examples of the receiving coil device having the structures shown in the drawings. Alternatively, the detection unit 50 may include a mechanism for bringing the receiving coil into close contact with the subject and have an arrangement corresponding to a mode of the mechanism and a member that moves integrally with the subject as long as the mechanism detects a movement of the member.

What is claimed is:

1. A receiving coil device for a magnetic resonance imaging apparatus, the receiving coil device comprising:
   one or more receiving coils configured to cover a head of a subject;
   a base portion on which the head of the subject is to be placed;
   a holder portion supported by the base portion, a receiving coil of the one or more receiving coils being fixed to the holder portion;
   a holder support portion configured to support the holder portion with respect to the base portion;
   two guide portions provided on the base portion to guide movement of the holder portion, the holder portion being supported by (i) one point fixed to the holder support portion and (ii) respective contact points of the two guide portions in contact with respective end portions of the holder portion;
   a mechanism portion configured to bring the receiving coil fixed to the holder portion into close contact with a part of the head; and
   a detection unit disposed on the base portion and configured to detect a body movement of the subject, the detection unit detecting a physical quantity related to a displacement of the holder portion corresponding to the body movement, the detection unit including a distance meter configured to determine a distance between an end portion of the holder portion and the base portion,
   wherein the detection unit detects a change in the distance between the end portion of the holder portion and the base portion, that exceeds a threshold value and necessitates re-acquisition of a nuclear magnetic resonance signal.

2. The receiving coil device according to claim 1, wherein the holder portion has a curved shape along both side surfaces from a front surface of the head when a surface of the head to be placed on the base portion is defined as a back surface and a surface on an opposite side of the head is defined as the front surface.

3. The receiving coil device according to claim 1, wherein the holder portion has a curved shape along both side surfaces of the head when a surface of the head to be placed on the base portion is defined as a back surface and a surface on an opposite side of the head is defined as a front surface, and
   the detection unit is an accelerometer that detects a movement of an end portion of the holder portion as the physical quantity.

4. The receiving coil device according to claim 1, wherein the detection unit includes a pressure gauge that is disposed between an end portion of the holder portion and a guide portion of the two guide portions, to detect a pressure change between the end portion of the holder portion and the guide portion as the physical quantity.

5. The receiving coil device according to claim 1, wherein the holder portion has a left side end portion and a right side end portion corresponding to left and right sides of the subject, and
   the left side end portion and the right side end portion of the holder portion are provided with the detection unit.

6. The receiving coil device according to claim 1, wherein the mechanism portion includes a movable portion that is fixed to the holder portion and to move the holder portion between a wearing position and a retreat position, and a support portion that supports the movable portion in a stepped manner with respect to the base portion.

7. The receiving coil device according to claim 6, wherein the movable portion is a mechanism that slides the holder portion along a shape of the head.

8. A magnetic resonance imaging apparatus comprising:
   a transmission unit including a transmitting coil that applies a high-frequency magnetic field to a subject placed in a static magnetic field;
   a reception unit including:
      one or more receiving coils configured to cover a head of the subject, each receiving coil receiving a nuclear magnetic resonance signal generated from the subject;
      a base portion on which the head of the subject is to be placed;
      a holder portion supported by the base portion, a receiving coil of the one or more receiving coils being fixed to the holder portion;
      a holder support portion configured to support the holder portion with respect to the base portion;
      two guide portions provided on the base portion to guide movement of the holder portion, the holder portion being supported by (i) one point fixed to the holder support portion and (ii) respective contact points of the two guide portions in contact with respective end portions of the holder portion;
      a mechanism portion configured to bring the receiving coil fixed to the holder portion into close contact with a part of the head; and
      a detection unit disposed on the base portion and configured to detect a body movement of the subject, the detection unit detecting a physical quantity related to a displacement of the holder portion corresponding to the body movement, the detection unit including a distance meter configured to determine a distance between an end portion of the holder portion and the base portion;
   a gradient magnetic field generation unit configured to generate a gradient magnetic field that gives position information to the nuclear magnetic resonance signal;
   a control unit configured to control the transmission unit, the gradient magnetic field generation unit, and the reception unit; and
   a calculation unit configured to create an image of the subject based on the nuclear magnetic resonance signal acquired under different gradient magnetic field conditions, wherein
   the detection unit detects a change in the distance between the end portion of the holder portion and the base portion, that exceeds a threshold value and necessitates re-acquisition of the nuclear magnetic resonance signal, and when the control unit determines based on the distance determined by the distance meter that re-acquisition is necessary, the control unit performs control to re-acquire the nuclear magnetic resonance signal.

9. The magnetic resonance imaging apparatus according to claim 8, wherein
   the calculation unit calculates a correction amount of the nuclear magnetic resonance signal based on the physical quantity detected by the detection unit, and corrects the nuclear magnetic resonance signal to reconstruct the image.

10. The magnetic resonance imaging apparatus according to claim 8, wherein
   the holder portion has a left side end portion and a right side end portion corresponding to left and right sides of the subject, and the calculation unit calculates a movement amount of the holder portion with a detection result of the detection unit provided on both the left side end portion and the right side end portion of the holder portion.

11. The magnetic resonance imaging apparatus according to claim 8, wherein
the holder portion is provided with a marker,
the reception unit further includes a camera disposed at a position where at least a part of the holder portion including the marker is in an image captured by the camera, and
the calculation unit calculates the physical quantity related to the displacement of the holder portion based on an image of the camera.

12. The magnetic resonance imaging apparatus according to claim 8, wherein at least one of the one or more receiving coils also serves as a transmitting coil.

\* \* \* \* \*